US009634626B2

(12) United States Patent
Zhong

(10) Patent No.: US 9,634,626 B2
(45) Date of Patent: Apr. 25, 2017

(54) INSTRUMENTATION AMPLIFIER

(71) Applicant: Vango Technologies, Inc., Hangzhou, Zhejiang (CN)

(72) Inventor: Shupeng Zhong, Zhejiang (CN)

(73) Assignee: Vango Technologies, Inc., Hangzhou, Zhejiang (CN)

( * ) Notice: Subject to any disclaimer, the term of this patent is extended or adjusted under 35 U.S.C. 154(b) by 0 days.

(21) Appl. No.: 14/709,057

(22) Filed: May 11, 2015

(65) Prior Publication Data

US 2016/0079941 A1 Mar. 17, 2016

(30) Foreign Application Priority Data

Sep. 15, 2014 (CN) .......................... 2014 1 0469046

(51) Int. Cl.
*H03F 1/02* (2006.01)
*H03F 3/45* (2006.01)
*H03F 3/387* (2006.01)

(52) U.S. Cl.
CPC ......... *H03F 3/387* (2013.01); *H03F 3/45475* (2013.01); *H03F 2200/261* (2013.01); *H03F 2200/271* (2013.01); *H03F 2203/45514* (2013.01); *H03F 2203/45551* (2013.01)

(58) Field of Classification Search
CPC ...... H03F 1/0205; H03F 3/211; H03F 3/2171; H03F 3/45179; H03F 2203/21109; H03F 2203/45116
USPC .......................... 330/69, 252–261, 9, 124 R
See application file for complete search history.

(56) References Cited

U.S. PATENT DOCUMENTS

| | | | |
|---|---|---|---|
| 7,629,838 B2* | 12/2009 | Lim | H03F 3/005 330/9 |
| 2013/0293294 A1* | 11/2013 | Lyden | H03G 3/008 330/69 |
| 2015/0311868 A1* | 10/2015 | Wan | H03F 1/0233 330/9 |

* cited by examiner

*Primary Examiner* — Steven J Mottola
*Assistant Examiner* — Hafizur Rahman
(74) *Attorney, Agent, or Firm* — U.S. Fairsky LLP; Yue Xu

(57) ABSTRACT

An instrumentation amplifier includes: a capacitive feedback closed-loop amplifier, an input capacitor charging module, a feedback capacitor discharging module, a noise separation module and a logic controller. The capacitive feedback closed-loop amplifier includes a fully differential operational amplifier, a first input capacitor, a second input capacitor, a first feedback capacitor and a second feedback capacitor. The input capacitor charging module is configured to charge the first input capacitor and the second input capacitor periodically. The feedback capacitor discharging module is configured to discharge the first feedback capacitor and the second feedback capacitor periodically. The noise separation module is configured to separate a noise from a signal using a chopping modulation technology. The logic controller is connected to the input capacitor charging module, the feedback capacitor discharging module and the noise separation module to control the modules to operate.

3 Claims, 3 Drawing Sheets

INSTRUMENTATION AMPLIFIER

CROSS-REFERENCES TO RELATED APPLICATIONS

The present application claims priority to Chinese Patent Application No. 201410469046.8, entitled as "INSTRUMENTATION AMPLIFIER", and filed with the Chinese Patent Office on Sep. 15, 2014, the contents of which are incorporated herein by reference in its entirety.

TECHNICAL FIELD

The disclosure relates to the technical field of high-accuracy measurement, and in particular to an instrumentation amplifier.

BACKGROUND

The instrumentation amplifier is a high-accuracy amplifier used for amplifying a weak differential signal, and is used widely in fields of high-accuracy measurement, such as an electronic scale, a pressure measurement, blood analysis, a sphygmomanometer, gas analysis and measurement, and electric energy analysis and measurement.

As shown in FIG. 1, an instrumentation amplifier in the conventional technology is illustrated, for which a closed-loop gain amplification function is achieved by means of two single-output operational amplifiers Av1 and Av2 and three resistors R0 to R2. The instrumentation amplifier has characters of a programmable amplification gain, a low temperature drift, high input impedance and high common-mode rejection ability, on the other hand, the instrumentation amplifier has the following disadvantages.

First, two operational amplifiers are used in the circuit design, resulting in that the cost and power consumption of the instrumentation amplifier are relatively high. Second, the amplification gain of the instrumentation amplifier is determined by the three resistors R0 to R2, the resistors generates a thermal noise, and the greater resistance the resistors have, the greater thermal noise is generated. In this case, a resistor with a lower resistance may be used to design the instrumentation amplifier with the lower noise. However, there will be a higher requirement of a drive capability for the two operational amplifiers Av1 and Av2 if the resistance of the resistor is lower, and as a result, the power consumption of the instrumentation amplifier becomes higher.

SUMMARY

In an aspect of this application, an instrumentation amplifier is provided, which has a low noise, a low cost but a reduced power consumption.

The instrumentation amplifier includes: a capacitive feedback closed-loop amplifier, an input capacitor charging module, a feedback capacitor discharging module, a noise separation module and a logic controller.

The capacitive feedback closed-loop amplifier includes a fully differential operational amplifier, a first input capacitor arranged at a positive input terminal of the fully differential operational amplifier, a second input capacitor arranged at a negative input terminal of the fully differential operational amplifier, a first feedback capacitor connected between a negative output terminal and the positive input terminal of the fully differential operational amplifier, and a second feedback capacitor connected between a positive output terminal and the negative input terminal of the fully differential operational amplifier.

The input capacitor charging module is connected to the first input capacitor and the second input capacitor to charge the first input capacitor and the second input capacitor periodically.

The feedback capacitor discharging module is connected to the first feedback capacitor and the second feedback capacitor to discharge the first feedback capacitor and the second feedback capacitor periodically.

The noise separation module is arranged on input and output sides of the capacitive feedback closed-loop amplifier to separate a noise from a signal using a chopping modulation technology.

The logic controller is connected to the input capacitor charging module, the feedback capacitor discharging module and the noise separation module to control the modules to operate.

The input capacitor charging module may include a first switch, a second switch, a third switch, a fourth switch, a fifth switch and a sixth switch.

The first switch is connected between one plate of the first input capacitor and a first voltage source, wherein the voltage of the first voltage source is the same as a common-mode voltage of a signal for the instrumentation amplifier.

The second switch is connected between the other plate of the first input capacitor and the second voltage source, wherein the voltage of the second voltage source is the same as a common-mode input voltage of the fully differential operational amplifier.

The third switch is connected between one plate of the second input capacitor and the first voltage source.

The fourth switch is connected between the other plate of the second input capacitor and the second voltage source.

The fifth switch has two ends. One end is connected to a connection point between the first switch and the first input capacitor. The other end is connected to a positive input terminal of the instrumentation amplifier.

The sixth switch has two ends. One end is connected to a connection point between the third switch and the second input capacitor, and the other end is connected to a negative input terminal of the instrumentation amplifier.

The feedback capacitor discharging module may include a seventh switch, an eighth switch, a ninth switch and a tenth switch.

The seventh switch is connected in parallel across the first feedback capacitor.

The eighth switch is connected in parallel across the second feedback capacitor.

The ninth switch has two ends. One end is connected to a connection point between the second switch and the first input capacitor, and the other end is connected to the positive input terminal of the fully differential operational amplifier.

The tenth switch has two ends. One end is connected to a connection point between the fourth switch and the second input capacitor, and the other end is connected to the negative input terminal of the fully differential operational amplifier.

The noise separation module may include an eleventh switch, a twelfth switch, a thirteenth switch, a fourteenth switch, a fifteenth switch, a sixteenth switch, a seventeenth switch and an eighteenth switch.

The eleventh switch is connected between the positive input terminal of the instrumentation amplifier and the fifth switch.

The twelfth switch is connected between the positive input terminal of the instrumentation amplifier and the sixth switch.

The thirteenth switch is connected between the negative input terminal of the instrumentation amplifier and the fifth switch.

The fourteenth switch is connected between the negative input terminal of the instrumentation amplifier and the sixth switch.

The fifteenth switch is connected between a negative output terminal of the instrumentation amplifier and the negative output terminal of the fully differential operational amplifier.

The sixteenth switch is connected between the negative output terminal of the instrumentation amplifier and the positive output terminal of the fully differential operational amplifier.

The seventeenth switch is connected between a positive output terminal of the instrumentation amplifier and the negative output terminal of the fully differential operational amplifier.

The eighteenth switch is connected between the positive output terminal of the instrumentation amplifier and the positive output terminal of the fully differential operational amplifier.

The logic controller may include: a first clock, a second clock, a third clock and a fourth clock.

The first clock and the second clock are a pair of clocks which are inverted and are not overlapped.

The third clock and the fourth clock are a pair of clocks which are inverted and are not overlapped.

The first clock is used to control the first switch, the second switch, the third switch, the fourth switch, the seventh switch and the eighth switch to be on or off simultaneously.

The second clock is used to control the fifth switch, the sixth switch, the ninth switch and the tenth switch to be on or off simultaneously.

The third clock is used to control the eleventh switch, the fourteenth switch, the fifteenth switch and the eighteenth switch to be on or off simultaneously.

The fourth clock is used to control the twelfth switch, the thirteenth switch, the sixteenth switch and the seventeenth switch to be on or off simultaneously.

The first input capacitor and the second input capacitor are all adjustable capacitors.

The noise may include a KT/C noise.

It can be seen from the above technique solutions that a closed-loop gain amplification function is achieved by means of one fully differential operational amplifier and four capacitors, the problems of input common-mode voltage instability and output saturation for the fully differential operational amplifier caused by introduction of the capacitors are avoided by using the input capacitor charging module and the feedback capacitor discharging module, and the noise is separated from the signal by using the noise separation module according to the disclosure. Compared with the conventional technology, the capacitors do not suffer from a thermal noise, and less operational amplifier is used. Therefore, according to the disclosure, the instrumentation amplifier with the lower noise and low cost is designed while the power consumption of the instrumentation amplifier is reduced, thereby improving the performance of the instrumentation amplifier.

BRIEF DESCRIPTION OF THE DRAWINGS

In order to illustrate the technical solutions according to the embodiments of the disclosure or in the conventional technology more clearly, the drawings to be used in the description of the conventional technology or the embodiments are described briefly hereinafter. Apparently, the drawings described hereinafter are only some embodiments of the present disclosure, and other drawings may be obtained by those skilled in the art according to those drawings without creative effort.

DETAILED DESCRIPTION

Hereinafter, the technical solutions in embodiments of the disclosure are described clearly and completely in conjunction with the drawings of the embodiments of the disclosure. It is apparent that the described embodiments are only a part of embodiments of the present disclosure. Other embodiments obtained by those skilled in the art on the basis of the embodiments of the present disclosure without creative work will fall into the scope of protection of the present disclosure.

Figure 1:
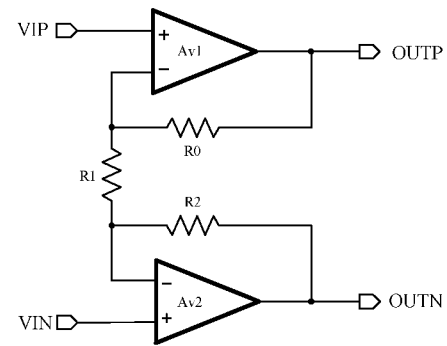
FIG. 1 is a schematic structural diagram of an instrumentation amplifier in the conventional technology.
Figure 2:
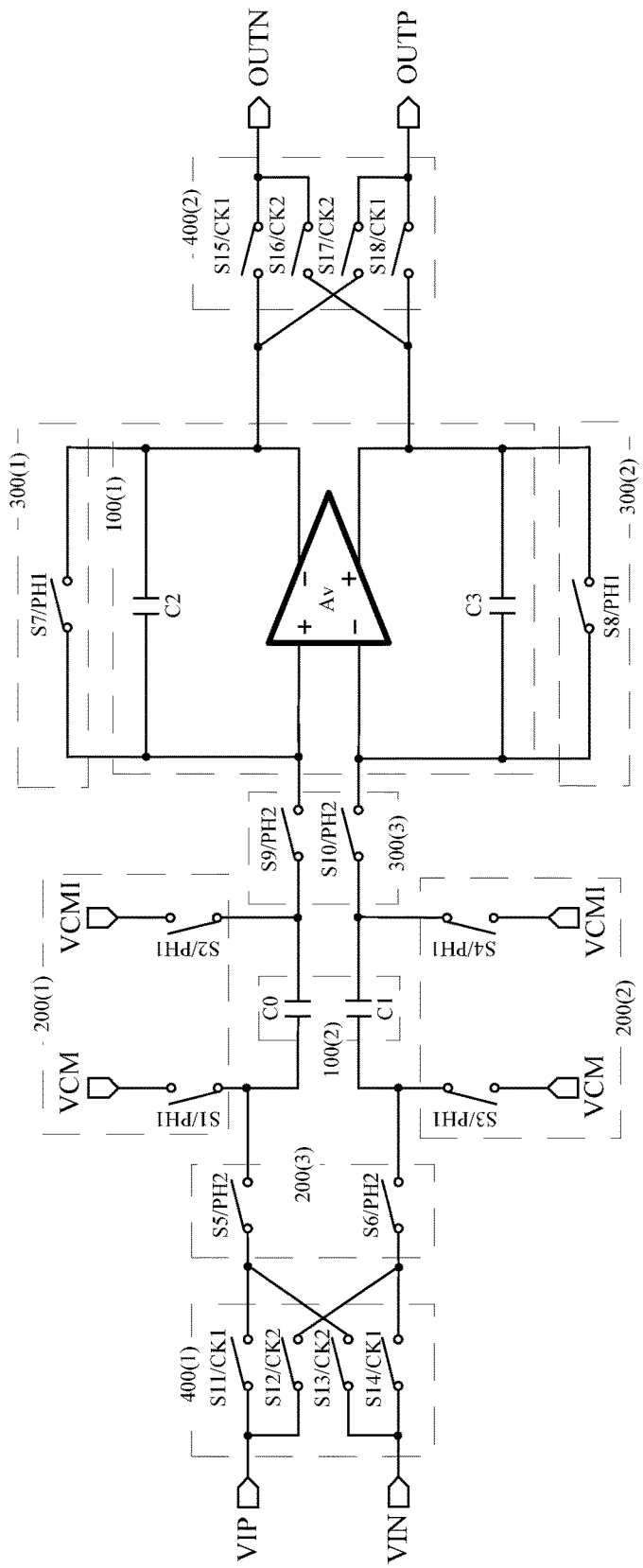
FIG. 2 is a schematic structural diagram of an instrumentation amplifier according to an embodiment of the disclosure.

Referring to FIG. 2, an instrumentation amplifier is disclosed according to an embodiment of the disclosure, so that the instrumentation amplifier with lower noise and low cost is designed while the power consumption of the instrumentation amplifier is reduced. The instrumentation amplifier includes a capacitive feedback closed-loop amplifier 100, an input capacitor charging module 200, a feedback capacitor discharging module 300, a noise separation module 400 and a logic controller.

The capacitive feedback closed-loop amplifier 100 includes a fully differential operational amplifier Av, a first input capacitor C0 arranged at a positive input terminal of the fully differential operational amplifier Av, a second input capacitor C1 arranged at a negative input terminal of the fully differential operational amplifier Av, a first feedback capacitor C2 connected between a negative output terminal and the positive input terminal of the fully differential operational amplifier Av, and a second feedback capacitor C3 connected between a positive output terminal and the negative input terminal of the fully differential operational amplifier Av.

The input capacitor charging module 200 is connected to the first input capacitor C0 and the second input capacitor C1 to charge the first input capacitor C0 and the second input capacitor C1 periodically.

The feedback capacitor discharging module 300 is connected to the first feedback capacitor C2 and the second feedback capacitor C3 to discharge the first feedback capacitor C2 and the second feedback capacitor C3 periodically.

The noise separation module 400 is arranged on input and output sides of the capacitive feedback closed-loop amplifier 100 to separate a noise from a signal using a chopping modulation technology.

The logic controller is connected to the input capacitor charging module 200, the feedback capacitor discharging module 300 and the noise separation module 400 to control the modules to operate.

According to the embodiment, a closed-loop gain amplification function is achieved by means of one fully differential operational amplifier and four capacitors, the problems of input common-mode voltage instability and output saturation for the fully differential operational amplifier Av caused by introduction of the capacitors are avoided by using the input capacitor charging module 200 and the feedback capacitor discharging module 300, and the noise is separated from the signal by using the noise separation module 400 (there must be a switch device in the input capacitor charging module 200 and the feedback capacitor discharging module 300 configured to charge and discharge the capacitors respectively, once the switch is used, a KT/C noise is inevitable for a switch capacitive structure, which is contrary to the design of an instrumentation amplifier with a lower noise, and therefore, the noise separation module 400 is required). Compared with the conventional technology, the capacitors do not suffer from a thermal noise, and less operational amplifier is used. Therefore, according to the embodiment, the instrumentation amplifier with lower noise is designed while the power consumption of the instrumentation amplifier is reduced, and the cost is reduced.

In order to describe the technical solution in the embodiment more clearly, in the following, the technical solution is described in greater detail in four aspects.

1) For the Capacitive Feedback Closed-Loop Amplifier 100

Figure 3:
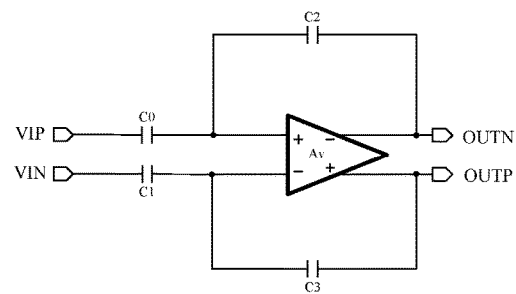
FIG. 3 is a schematic structural diagram of a capacitive feedback closed-loop amplifier according to an embodiment of the disclosure.

In order to overcome the disadvantages of the instrumentation amplifier in the conventional technology, the closed-loop gain amplification function is achieved by means of one fully differential operational amplifier and four capacitors, and thus the capacitive feedback closed-loop amplifier 100 is constructed according to the embodiment. As shown in FIG. 3, a topological structure for the capacitive feedback closed-loop amplifier 100 includes a fully differential operational amplifier Av, a first input capacitor C0, a second input capacitor C1, a first feedback capacitor C2 and a second feedback capacitor C3.

The first input capacitor C0 is arranged at the positive input terminal of the fully differential operational amplifier Av, where the first plate of the first input capacitor C0 is connected to a positive input terminal VIP of the instrumentation amplifier and the second plate of the first input capacitor C0 is connected to the positive input terminal of the fully differential operational amplifier Av.

The second input capacitor C1 is arranged at the negative input terminal of the fully differential operational amplifier Av, where the first plate of the second input capacitor C1 is connected to a negative input terminal VIN of the instrumentation amplifier and the second plate of the second input capacitor C1 is connected to the negative input terminal of the fully differential operational amplifier Av.

The first feedback capacitor C2 is connected between the negative output terminal and the positive input terminal of the fully differential operational amplifier Av, where the negative output terminal of the fully differential operational amplifier Av is connected to a negative output terminal OUTN of the instrumentation amplifier.

The second feedback capacitor C3 is connected between the positive output terminal and the negative input terminal of the fully differential operational amplifier Av, where the positive output terminal of the fully differential operational amplifier Av is connected to a positive output terminal OUTP of the instrumentation amplifier.

An amplification gain A of the above capacitive feedback closed-loop amplifier 100 is obtained by the following expression, $A=C0/C2=C1/C3$. In order that the amplification gain of the instrumentation amplifier is programmable, the first input capacitor C0 and the second input capacitor C1 are adjustable capacitors, for which a capacitance value may be set to any value, such as $1C2$, $4C2$, $16C2$ or $64C2$, to obtain different closed-loop gains such as one, four, sixteen or sixty-four according to the embodiment. Certainly, in order that the amplification gain of the instrumentation amplifier is programmable, the first feedback capacitor C2 and the second feedback capacitor C3 both may be adjustable capacitors, or the first input capacitor C0, the second input capacitor C1, the first feedback capacitor C2 and the second feedback capacitor C3 may be adjustable capacitors, which is not defined.

Compared with the instrumentation amplifier in the conventional technology, the capacitors are used, instead of the resistors, to achieve the closed-loop gain amplification function for the capacitive feedback closed-loop amplifier 100, and the capacitors do not suffer from the thermal noise, and therefore, the instrumentation amplifier with the lower thermal noise is designed while the power consumption of the instrumentation amplifier is reduced. Moreover, since only one operational amplifier is required for the capacitive feedback closed-loop amplifier 100, the footprint is less and the power consumption is reduced.

However, there are the following disadvantages for the capacitive feedback closed-loop amplifier 100.

Since the capacitors C0 to C3 are passive devices, electric charges on the capacitors C0 to C3 will be leaked gradually, such that the input common-mode voltage of the fully differential operational amplifier Av is unstable and the output of the fully differential operational amplifier Av enters a saturation state.

2) For the Input Capacitor Charging Module 200 and the Feedback Capacitor Discharging Module 300

In order to overcome the disadvantages of the capacitive feedback closed-loop amplifier 100, the input capacitor charging module 200 and the feedback capacitor discharging module 300 are designed, in which the input capacitor charging module 200 is configured to charge the first input capacitor C0 and the second input capacitor C1 periodically and the feedback capacitor discharging module 300 is configured to discharge the first feedback capacitor C2 and the second feedback capacitor C3 periodically, on the basis of the topological structure as shown in FIG. 3 according to the embodiment.

Referring still to FIG. 2, the input capacitor charging module 200 includes:

a first switch S1 connected between one plate of the first input capacitor C0 and the first voltage source, wherein an output voltage VCM of the first voltage source is the same as a common-mode voltage of a signal for the instrumentation amplifier;

a second switch S2 connected between the other plate of the first input capacitor C0 and the second voltage source, wherein an output voltage VCMI of the second voltage source is the same as a common-mode input voltage of the fully differential operational amplifier Av;

a third switch S3 connected between one plate of the second input capacitor C1 and the first voltage source;

a fourth switch S4 connected between the other plate of the second input capacitor C1 and the second voltage source;

a fifth switch S5, wherein one end of the fifth switch S5 is connected to a connection point between the first switch S1 and the first input capacitor C0, and the other end of the fifth switch S5 is connected to the positive input terminal VIP of the instrumentation amplifier; and a sixth switch S6, wherein one end of the sixth switch S6 is connected to a connection point between the third switch S3 and the second input capacitor C1, and the other end of the sixth switch S6 is connected to the negative input terminal VIN of the instrumentation amplifier.

In the input capacitor charging module 200, the first switch S1, the second switch S2, the third switch S3 and the fourth switch S4 are turned on periodically. In this case, the first voltage source and the second voltage source charge the first input capacitor C0 and the second input capacitor C1 periodically to stabilize the common-mode input voltage of the fully differential operational amplifier Av to be VCMI and stabilize the common-mode voltage on the first plates of the first input capacitor C0 and the second input capacitor C1 to be VCM.

During the charging of the first input capacitor C0 and the second input capacitor C1, since the first switch S1 and the third switch S3 both are turned on, the fifth switch S5 and the sixth switch S6 are designed to be turned off according to the embodiment, to prevent the first voltage source from shorting to the positive input terminal VIP and the negative input terminal VIN of the instrumentation amplifier.

Specifically, the first switch S1, the second switch S2, the third switch S3 and the fourth switch S4 are controlled by the first clock PH1 in the logic controller of the instrumentation amplifier, the fifth switch S5 and the sixth switch S6 are controlled by the second clock PH2 in the logic controller, and the first clock PH1 and the second clock PH2 are a pair of clocks which are inverted and are not overlapped. The 'are inverted and are not overlapped' means that the PH1 is not obtained by inverting the PH2 directly, and it is necessary that the PH1 becomes a high level after the PH2 changes from the high level to a low level for a period of time, similarly, the PH2 becomes the high level after the PH1 changes from the high level to the low level for a period of time.

Referring still further to FIG. 2, the feedback capacitor discharging module 300 includes:

a seventh switch S7 connected in parallel across the first feedback capacitor C2;

an eighth switch S8 connected in parallel across the second feedback capacitor C3;

a ninth switch S9, wherein one end of the ninth switch S9 is connected to a connection point between the second switch S2 and the first input capacitor C0, and the other end of the ninth switch S9 is connected to the positive input terminal of the fully differential operational amplifier Av; and a tenth switch S10, wherein one end of the tenth switch S10 is connected to a connection point between the fourth switch S4 and the second input capacitor C1, and the other end of the tenth switch S10 is connected to the negative input terminal of the fully differential operational amplifier Av.

Since the first feedback capacitor C2 and the second feedback capacitor C3 have small capacitance values, the electric charge is prone to be injected into the first feedback capacitor C2 and the second feedback capacitor C3 (the injected electric charge comes from the first voltage source and the second voltage source). The electric charges accumulated for a long period of time may cause the voltages on the first feedback capacitor C2 and the second feedback capacitor C3 to be excessive, and thus the output of the fully differential operational amplifier Av is saturated. In order to solve this problem, the seventh switch S7 and the eighth switch S8 are designed to be turned on periodically according to the embodiment. In this case, a current path is formed by the seventh switch S7 and the first feedback capacitor C2 to discharge the first feedback capacitor C2, while another current path is formed by the eighth switch S8 and the second feedback capacitor C3 to discharge the second feedback capacitor C3. The discharging time for the two feedback capacitors (namely the first feedback capacitor C2 and the second feedback capacitor C3) is synchronized with the charging time for the two input capacitors (namely the first input capacitor C0 and the second input capacitor C1).

Considering that during the charging of the first input capacitor C0 and the second input capacitor C1 and the discharging of the first feedback capacitor C2 and the second feedback capacitor C3, the second switch S2, the fourth switch S4, the seventh switch S7 and the eighth switch S8 are turned on, equivalently, the positive and negative input terminals and the positive and negative output terminals of the fully differential operational amplifier Av are shorted to the voltage VCMI. In this case, existence of the offset voltage of the fully differential operational amplifier Av will cause the fully differential operational amplifier Av to output a considerable current. In order to solve this problem, the ninth switch S9 and the tenth switch S10 are designed to be turned off according to the embodiment. Specifically, the seventh switch S7 and the eighth switch S8 are controlled by the first clock PH1 in the logic controller, and the ninth switch S9 and the tenth switch 10 are controlled by the second clock PH2 in the logic controller.

3) For the Noise Separation Module 400

Due to the existence of the switches S1 to S10, a KT/C noise is injected inevitably onto the first input capacitor C0, the second input capacitor C1, the first feedback capacitor C2 and the second feedback capacitor C3. The noise separation module 400 is designed according to the embodiment to achieve the instrumentation amplifier with the lower noise.

Referring still further to FIG. 2, the noise separation module 400 includes:

an eleventh switch S11 connected between the positive input terminal VIP of the instrumentation amplifier and the fifth switch S5;

a twelfth switch S12 connected between the positive input terminal VIP of the instrumentation amplifier and the sixth switch S6;

a thirteenth switch S13 connected between the negative input terminal VIN of the instrumentation amplifier and the fifth switch S5;

a fourteenth switch S14 connected between the negative input terminal VIN of the instrumentation amplifier and the sixth switch S6;

a fifteenth switch S15 connected between a negative output terminal OUTN of the instrumentation amplifier and the negative output terminal of the fully differential operational amplifier Av;

a sixteenth switch S16 connected between the negative output terminal OUTN of the instrumentation amplifier and the positive output terminal of the fully differential operational amplifier Av;

a seventeenth switch S17 connected between a positive output terminal OUTP of the instrumentation amplifier and the negative output terminal of the fully differential operational amplifier Av; and an eighteenth switch S18 connected between the positive output terminal OUTP of the instrumentation amplifier and the positive output terminal of the fully differential operational amplifier Av.

Considering that the KT/C noise is a narrow-band noise, the noise separation module 400 modulates the KT/C noise to be in a higher frequency band to separate the KT/C noise from the signal by using the chopping modulation technology, such that it is convenient for the subsequent circuit to filter out the KT/C noise. The chopping modulation technology is implemented by using the switches in the noise separation module 400. Specifically, the eleventh switch S11, the fourteenth switch S14, the fifteenth switch S15 and the eighteenth switch S18 are controlled by the third clock CK1 in the logic controller, the twelfth switch S12, the thirteenth switch S13, the sixteenth switch S16 and the seventeenth switch S17 are controlled by the fourth clock CK2 in the logic controller, and the third clock CK1 and the fourth clock CK2 are a pair of clocks which are inverted and are not overlapped.

With the chopping modulation technology, the signal is modulated to be in a high frequency by using the eleventh switch S11, the twelfth switch S12, the thirteenth switch S13 and the fourteenth switch S14, to evade the narrow-band KT/C noise; after the modulated signal is amplified via the fully differential operational amplifier Av, the amplified modulated signal is demodulated back to be in a low frequency by using the fifteenth switch S15, the sixteenth switch S16, the seventeenth switch S17 and the eighteenth switch S18, while the KT/C noise is modulated to be in a higher frequency, and thus the signal is amplified and the noise is separated. Moreover, the offset voltage and a flicker noise for the fully differential operational amplifier Av may also be modulated to be in a high frequency synchronously, of which the principle is consistent with that of the KT/C noise.

4) Summarizing the Composition and Operational Principle of the Logic Controller The logic controller include a first clock PH1, a second clock PH2, a third clock CK1 and a fourth clock CK2, wherein the first clock PH1 and the second clock PH2 are a pair of clocks which are inverted and are not overlapped;

the third clock CK1 and the fourth clock CK2 are a pair of clocks which are inverted and are not overlapped;

the first clock PH1 is configured to control the first switch S1, the second switch S2, the third switch S3, the fourth switch S4, the seventh switch S7 and the eighth switch S8 to be on or off simultaneously;

the second clock PH2 is configured to control the fifth switch S5, the sixth switch S6, the ninth switch S9 and the tenth switch S10 to be on or off simultaneously;

the third clock CK1 is configured to control the eleventh switch S11, the fourteenth switch S14, the fifteenth switch S15 and the eighteenth switch S18 to be on or off simultaneously; and the fourth clock CK2 is configured to control the twelfth switch S12, the thirteenth switch S13, the sixteenth switch S16 and the seventeenth switch S17 to be on or off simultaneously.

In practical application, the four clocks PH1, PH2, CK1 and CK2 and the seventeen controlled switches S1 to S17 may be set as follows.

The PH1, PH2, CK1 and CK2 control the seventeen controlled switches to be turned on in the case of the high level or be turned off in the case of the low level. The frequency of PH1/PH2 is equal to 1/N (N is an integer greater than 2) of CK1/CK2; the duty cycle of the PH1 is very small, and the duration of the high level for the PH1 is equal to ½ of the duration of the high level for the CK1; the duty cycle of CK1/CK2 is slightly smaller than 50%; and a rising edge of the first clock PH1 is substantially aligned to that of the third clock CK1.

Figure 4:
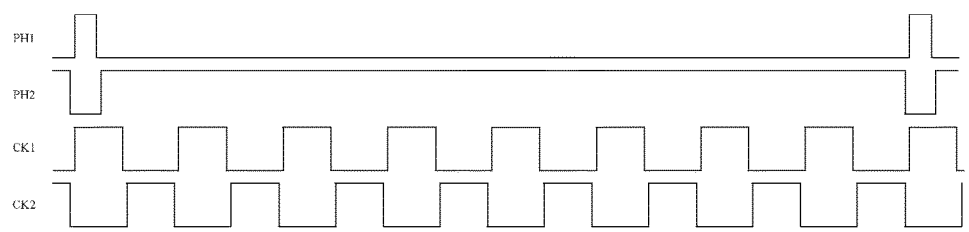
FIG. 4 is a waveform diagram of the first clock PH1, the second clock PH2, the third clock CK1 and the fourth clock CK2 according to an embodiment of the disclosure.

Under this setting, assumed that N is equal to 8, waveforms of the first clock PH1, the second clock PH2, the third clock CK1 and the fourth clock CK2 are shown in FIG. 4.

In general, the closed-loop gain amplification function is achieved by means of one fully differential operational amplifier and four capacitors, the problems of input common-mode voltage instability and output saturation for the fully differential operational amplifier due to the introduction of the capacitors are avoided by using the input capacitor charging module and the feedback capacitor discharging module, and the noise is separated from the signal by using the noise separation module according to the disclosure. Compared with the conventional technology, the capacitors do not suffer from a thermal noise, and less operational amplifier is used. Therefore, according to the disclosure, the instrumentation amplifier with the lower noise and low cost is designed while the power consumption of the instrumentation amplifier is reduced, thereby improving the performance of the instrumentation amplifier.

The description of the embodiments herein enables those skilled in the art to implement or use the present disclosure. Numerous modifications to the embodiments will be apparent to those skilled in the art, and the general principle herein can be implemented in other embodiments without deviation from the spirit or scope of the present disclosure. Therefore, the present disclosure is not limited to the embodiments described herein, but in accordance with the widest scope consistent with the principle and novel features disclosed herein.

The invention claimed is:

1. An instrumentation amplifier, comprising:
   a capacitive feedback closed-loop amplifier, an input capacitor charging module, a feedback capacitor discharging module, a noise separation module and a logic controller,
   wherein the capacitive feedback closed-loop amplifier comprises a fully differential operational amplifier, a first input capacitor arranged at a positive input terminal of the fully differential operational amplifier, a second input capacitor arranged at a negative input terminal of the fully differential operational amplifier, a first feedback capacitor connected between a negative output terminal and the positive input terminal of the fully differential operational amplifier, and a second feedback capacitor connected between a positive output terminal and the negative input terminal of the fully differential operational amplifier;
   the input capacitor charging module is connected to the first input capacitor and the second input capacitor to charge the first input capacitor and the second input capacitor periodically;
   the feedback capacitor discharging module is connected to the first feedback capacitor and the second feedback capacitor to discharge the first feedback capacitor and the second feedback capacitor periodically;
   the noise separation module is arranged on input and output sides of the capacitive feedback closed-loop amplifier to separate a noise from a signal using a chopping modulation technology; and
   the logic controller is connected to the input capacitor charging module, the feedback capacitor discharging module and the noise separation module to control the modules to operate; and
   wherein the input capacitor charging module comprises:
   a first switch connected between one plate of the first input capacitor and the first voltage source, wherein an output voltage of the first voltage source is the same as a common-mode voltage of a signal for the instrumentation amplifier;

a second switch connected between the other plate of the first input capacitor and the second voltage source, wherein an output voltage of the second voltage source is the same as a common-mode input voltage of the fully differential operational amplifier;

a third switch connected between one plate of the second input capacitor and the first voltage source;

a fourth switch connected between the other plate of the second input capacitor and the second voltage source;

a fifth switch, wherein one end of the fifth switch is connected to a connection point between the first switch and the first input capacitor, and the other end of the fifth switch is connected to a positive input terminal of the instrumentation amplifier; and a sixth switch, wherein one end of the sixth switch is connected to a connection point between the third switch and the second input capacitor, and the other end of the sixth switch is connected to a negative input terminal of the instrumentation amplifier;

the feedback capacitor discharging module comprises:

a seventh switch connected in parallel across the first feedback capacitor;

an eighth switch connected in parallel across the second feedback capacitor;

a ninth switch, wherein one end of the ninth switch is connected to a connection point between the second switch and the first input capacitor, and the other end of the ninth switch is connected to the positive input terminal of the fully differential operational amplifier; and a tenth switch, wherein one end of the tenth switch is connected to a connection point between the fourth switch and the second input capacitor, and the other end of the tenth switch is connected to the negative input terminal of the fully differential operational amplifier;

the noise separation module comprises:

an eleventh switch connected between the positive input terminal of the instrumentation amplifier and the fifth switch;

a twelfth switch connected between the positive input terminal of the instrumentation amplifier and the sixth switch;

a thirteenth switch connected between the negative input terminal of the instrumentation amplifier and the fifth switch;

a fourteenth switch connected between the negative input terminal of the instrumentation amplifier and the sixth switch;

a fifteenth switch connected between a negative output terminal of the instrumentation amplifier and the negative output terminal of the fully differential operational amplifier;

a sixteenth switch connected between the negative output terminal of the instrumentation amplifier and the positive output terminal of the fully differential operational amplifier;

a seventeenth switch connected between a positive output terminal of the instrumentation amplifier and the negative output terminal of the fully differential operational amplifier; and an eighteenth switch connected between the positive output terminal of the instrumentation amplifier and the positive output terminal of the fully differential operational amplifier;

the logic controller comprises: a first clock, a second clock, a third clock and a fourth clock, wherein the first clock and the second clock are a pair of clocks which are inverted and are not overlapped;

the third clock and the fourth clock are a pair of clocks which are inverted and are not overlapped;

the first clock is configured to control the first switch, the second switch, the third switch, the fourth switch, the seventh switch and the eighth switch to be on or off simultaneously;

the second clock is configured to control the fifth switch, the sixth switch, the ninth switch and the tenth switch to be on or off simultaneously;

the third clock is configured to control the eleventh switch, the fourteenth switch, the fifteenth switch and the eighteenth switch to be on or off simultaneously; and the fourth clock is configured to control the twelfth switch, the thirteenth switch, the sixteenth switch and the seventeenth switch to be on or off simultaneously.

2. The instrumentation amplifier according to claim 1, wherein the first input capacitor and the second input capacitor are adjustable capacitors.

3. The instrumentation amplifier according to claim 1, wherein the noise comprises a KT/C noise.

* * * * *